United States Patent [19]
Schaefer et al.

[11] Patent Number: 5,861,748
[45] Date of Patent: Jan. 19, 1999

[54] MULTI-TUNED SINGLE COIL TRANSMISSION LINE PROBE FOR NUCLEAR MAGNETIC RESONANCE SPECTROMETER

[76] Inventors: Jacob Schaefer, 7146 Kingsbury Blvd., University City, Mo. 63130; Robert A. McKay, 1537 Virginia Ave., Ellisville, Mo. 63011

[21] Appl. No.: 889,922

[22] Filed: Jul. 10, 1997

[51] Int. Cl.⁶ .................................................. G01V 3/00
[52] U.S. Cl. ............................................ 324/318; 600/422
[58] Field of Search ..................... 324/318, 322, 324/314, 300, 312, 307, 309; 600/421, 422

[56] References Cited

U.S. PATENT DOCUMENTS

| | | | |
|---|---|---|---|
| 2,908,858 | 10/1959 | Nelson | 324/300 |
| 3,372,331 | 3/1968 | Larson | 324/300 |
| 3,402,346 | 9/1968 | Baker | 324/300 |
| 3,434,043 | 3/1969 | Nelson | 324/300 |
| 3,795,855 | 3/1974 | Browning | 324/300 |
| 3,858,112 | 12/1974 | Satoh et al. | 324/300 |
| 4,051,429 | 9/1977 | Imanari et al. | 324/300 |
| 4,093,910 | 6/1978 | Hill | 324/300 |
| 4,093,911 | 6/1978 | Hill et al. | 324/300 |
| 4,095,168 | 6/1978 | Hlavka | 324/300 |
| 4,129,822 | 12/1978 | Traficante | 324/300 |
| 4,446,431 | 5/1984 | McKay | 324/318 |
| 4,792,759 | 12/1988 | Keren et al. | 324/318 |
| 4,985,680 | 1/1991 | Maeda et al. | 324/318 |
| 5,675,254 | 10/1997 | Fiat et al. | 324/318 |
| 5,742,165 | 4/1998 | Snelten et al. | 324/318 |

*Primary Examiner*—Louis Arana
*Attorney, Agent, or Firm*—Polster, Lieder, Woodruff & Lucchesi, L.C.

[57] ABSTRACT

A probe for a nuclear magnetic resonance spectrometer having improved sensitivity and efficiency is described, comprising an impedance matched and tuned coaxial transmission network, multiple radio frequency input-output connections, and a single sample coil. Each individual radio frequency input-output connector and its associated capacitive impedance matching and tuning circuitry is remotely disposed from the magnetic field of the spectrometer. Additional radio frequency input-output connectors of lower frequencies may be modularly added and removed from the probe without altering the impedance settings of high frequency connectors already present.

20 Claims, 3 Drawing Sheets

MULTI-TUNED SINGLE COIL TRANSMISSION LINE PROBE FOR NUCLEAR MAGNETIC RESONANCE SPECTROMETER

STATEMENT REGARDING FEDERALLY SPONSORED RESEARCH OR DEVELOPMENT

This invention was made at least in part with funds from the Federal government, and the government therefore may have certain rights in the invention.

BACKGROUND OF THE INVENTION

The present invention relates to probes for nuclear magnetic resonance (NMR) spectrometers and specifically to a capacitance tuned probe employing a single sample coil suitable for multiple radio frequency resonance experiments, wherein the tuning elements of the probe are remotely disposed from the magnetic field, connected to the sample coil by means of coaxial transmission lines.

In nuclear magnetic resonance machines, a high-intensity uniform magnetic field is generated within an extremely strong magnet. Inserted into the axial bore of the magnet is the sample to be analyzed, and the combination radio frequency transmitting and receiving sample coil. The sample coil is situated to generate an oscillating field with a component at right angles to the main magnetic field. The oscillating radio frequency field causes an oscillation in the alignment of the nuclear spins present in the sample undergoing analysis. The oscillation of the various chemical species within the magnet causes the emission of radio frequency signals, which are received by the sample coil and associated probe circuits.

For some NMR analyses, particularly those involving solid sample materials, it is often desired to irradiate the sample with radio frequency fields of multiple frequencies at relatively high power levels, for example, in the 300 to 1000 watt range. It is important that a good coupling be achieved at all of the frequencies used. The usefulness and efficiency of prior art probes for this application is limited due to the size and magnetic restrictions for probe components, and the limited number of frequencies (usually only two or three) at which the samples may be irradiated without the operator removing and adjusting the probe settings. Each such removal and adjustment operation extends the time required to complete the sample analysis, and increases the chances of calibration and operator error.

The efficiency of prior art probes is additionally limited by their design characteristics. Traditionally, the desired radio frequencies were impedance matched to a particular value using standard, well known inductor techniques. However, while employing inductors is well known to generate impedance minima, inductors are characterized by high radio frequency losses, lowering the overall probe efficiency. Similar radio frequency losses result from each of the numerous interconnecting leads required between prior art probe components.

SUMMARY OF THE INVENTION

Among the several objects and advantages of the present invention include:

The provision of a new and improved probe for a nuclear magnetic resonance (NMR) spectrometer in which the tuning elements are remotely connected to the sample coil via a coaxial transmission line having low radio frequency losses;

The provision of the aforementioned probe which includes capacitive tuning elements integrated into the transmission line to reduce interconnection and inductor radio frequency losses;

The provision of the aforementioned probe which positions the tuning elements outside the probe magnet and the associated magnetic field;

The provision of the aforementioned probe which includes a single sample coil;

The provision of the aforementioned probe which includes the capability to tune multiple radio frequencies on separate channels without the need for frequent probe recalibration;

The provision of the aforementioned probe which includes the capacity to tune additional lower frequency channels without altering the settings of higher frequency channels;

The provision of the aforementioned probe which includes the capability of operating on samples in potentially harmful environments;

The provision of the aforementioned probe which includes the ability to operate on solid sample materials; and The provision of the aforementioned probe which includes robust components capable of withstanding high power levels.

The multi-tuned single coil transmission line probe of the present invention provides a high degree of efficiency for both the irradiation of samples and the detection of the induced nuclear magnetic resonance signals. The probe comprises a single sample coil connected to a multi-tuned circuit, including a coaxial line transmission network, and multiple radio frequency input-output means. The transmission network is preferably composed of copper pipe or tubing having sectional lengths proportional to the radio frequency wavelengths of the input-output means, and a large outer diameter, on the order of 2 inches or more for increased efficiency, reduced electrical resistance, and the internal placement of the tuning circuits. The inner and outer conductors of the coaxial transmission line are structured such that the ratio of the inner diameter of the outer tube to the outer diameter of the inner tube is approximately 3.59:1.

The multiple radio frequency input-output means of the present embodiment are each adapted to a unique radio frequency in the range from 50 MHz to 500 MHz, however, additional lower frequencies are not excluded from the probe design. The unique radio frequency for each input-output means is separated from the frequency of the next nearest input-output means by not less than a 6% difference. Each input-output means is connected to the coaxial transmission line by a capacitive tuning and matching circuit composed of variable capacitors positioned inside the outer conductor of the coaxial transmission line. The tuning and matching circuit connections for a particular frequency are located along segments of coaxial transmission line interconnected at points where the input-output means for the previous channel has an impedance minima. In general this will be the next lower frequency but as more channels are added, the frequency of the next occurring minima will not necessarily be the next lower frequency.

An important feature of the invention is the large number of radio frequency input-output means connected to the single sample coil via the coaxial line transmission network. This larger number reduces the chances for operator error during calibration by eliminating the need for the operator to remove the probe to change the radio frequencies at which the sample is being irradiated. Another important feature of the invention is the elimination of the need for the use of inductive tuning components, with the associated high radio frequency losses, for impedance matching purposes.

The foregoing and other objects, features, and advantages of the invention as well as presently preferred embodiments thereof will become more apparent from the reading of the following description in connection with the accompanying drawings.

BRIEF DESCRIPTION OF THE DRAWINGS

In the accompanying drawings which form part of the specification.

Corresponding reference numerals will be used to indicate corresponding parts throughout the several figures of the drawings.

DESCRIPTION OF THE PREFERRED EMBODIMENT

The following detailed description illustrates the invention by way of example and not by way of limitation. The description will clearly enable one skilled in the art to make and use the invention, describes several embodiments, adaptations, variations, alternatives, and uses of the invention, including what we presently believe is the best mode of carrying out the invention.

Figure 1:
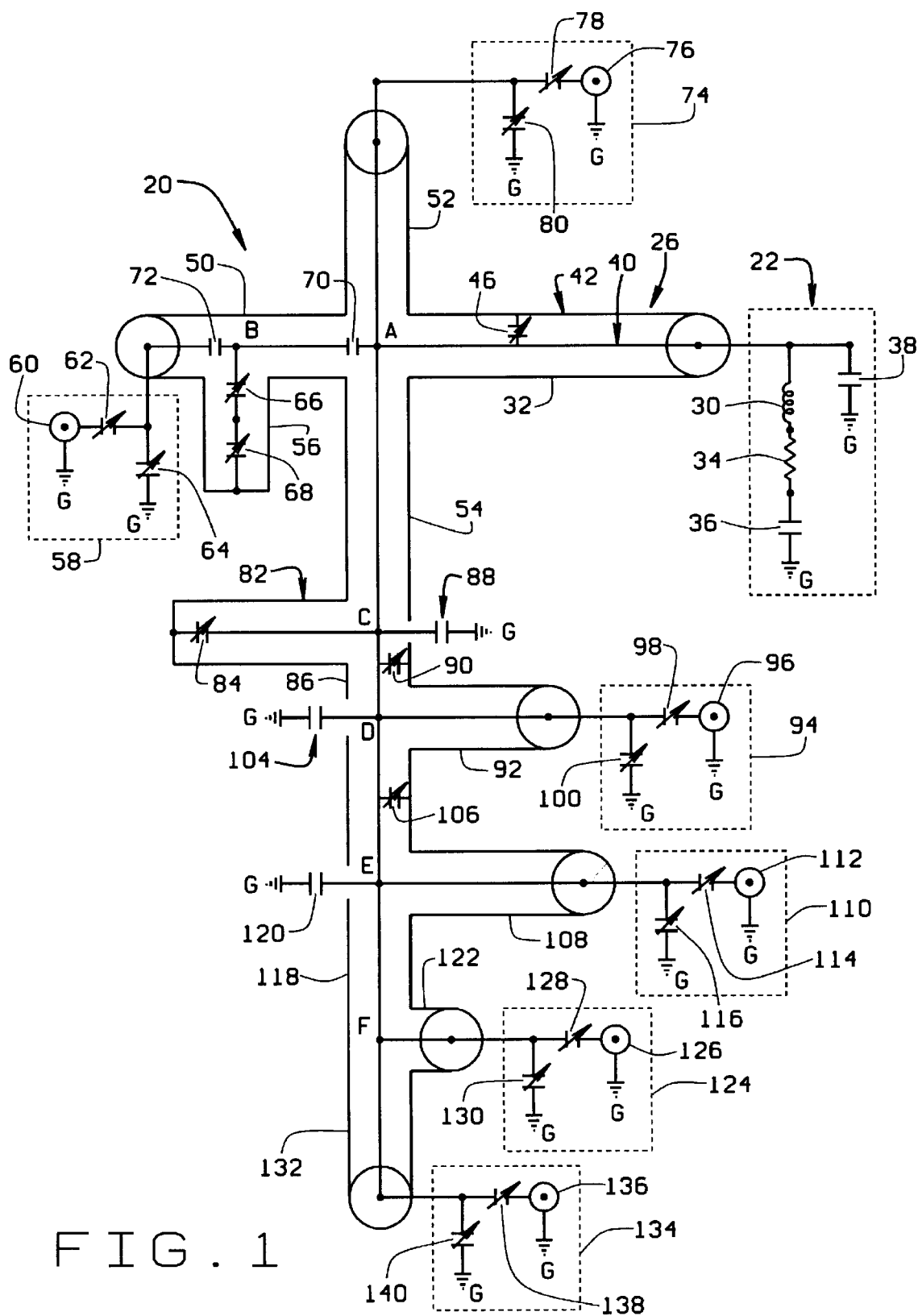
FIG. 1 is a detailed circuit diagram of a six-frequency-tuned embodiment of the multi-tuned single coil transmission line probe described herein.
Figure 2:
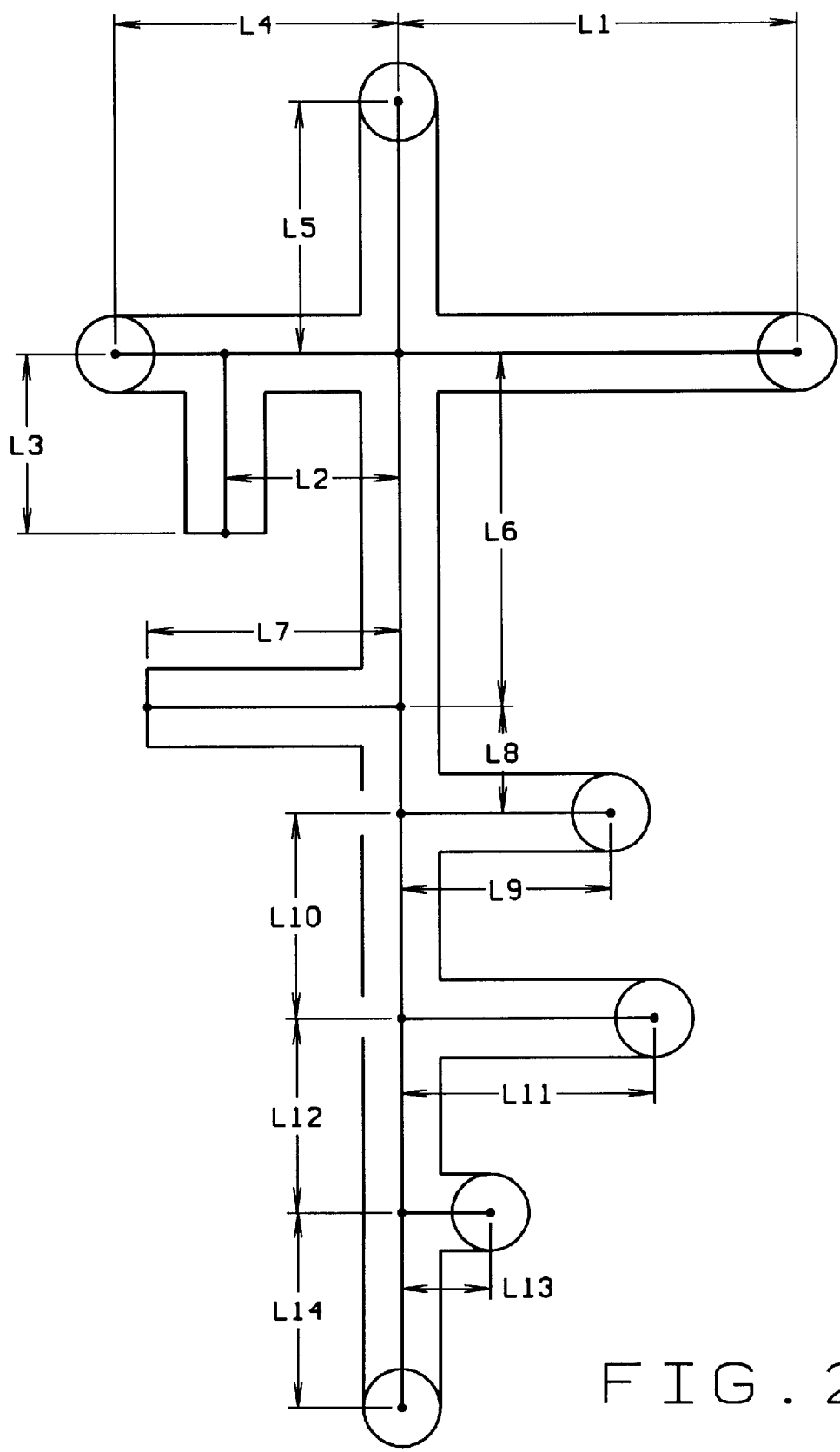
FIG. 2 is a view similar to FIG. 1 in which the individual circuit elements have been omitted so that necessary measurements may be more clearly shown.

Referring to FIGS. 1 and 2, there is shown a circuit diagram of the multi-tuned NMR probe 20 of the present invention, configured for operation on six separate radio frequencies. A sample coil circuit 22, disposed within a magnet 24 and connected to an external transmission network 26 is employed to excite a sample 28 under analysis, detecting its magnetic resonance signature. The sample coil circuit 22 comprises a sample coil 30, connected between a coaxial line segment 32 of the transmission network 26 and electrical ground G. Connected in series between the sample coil 30 and the electrical ground G is a resistor 34 and fixed capacitor 36. To maintain a high degree of efficiency for the NMR probe, the magnitude of the resistor 34 corresponds to the inherent loss of the sample coil 30, as minimized through standard radio frequency techniques. Similarly, the fixed capacitor 36 is used to provide an impedance for the sample coil 30, aiding in the tuning of individual probe frequencies. The optimum capacitance level for the fixed capacitor 36 is determined by analyzing the efficiency of the NMR probe 20 for each incorporated frequency, and selecting an optimum capacitance level resulting in the least amount of tuning interference over all the frequencies.

Included for computational purposes, but not as an added component, a second fixed capacitor 38 is shown in FIG. 1 connected in parallel with the sample coil 30, between the segment 32 and electrical ground G. The fixed capacitor 38 represents the combination of the distributed capacitance and stray capacitance to ground of the sample coil 30.

Figure 3:
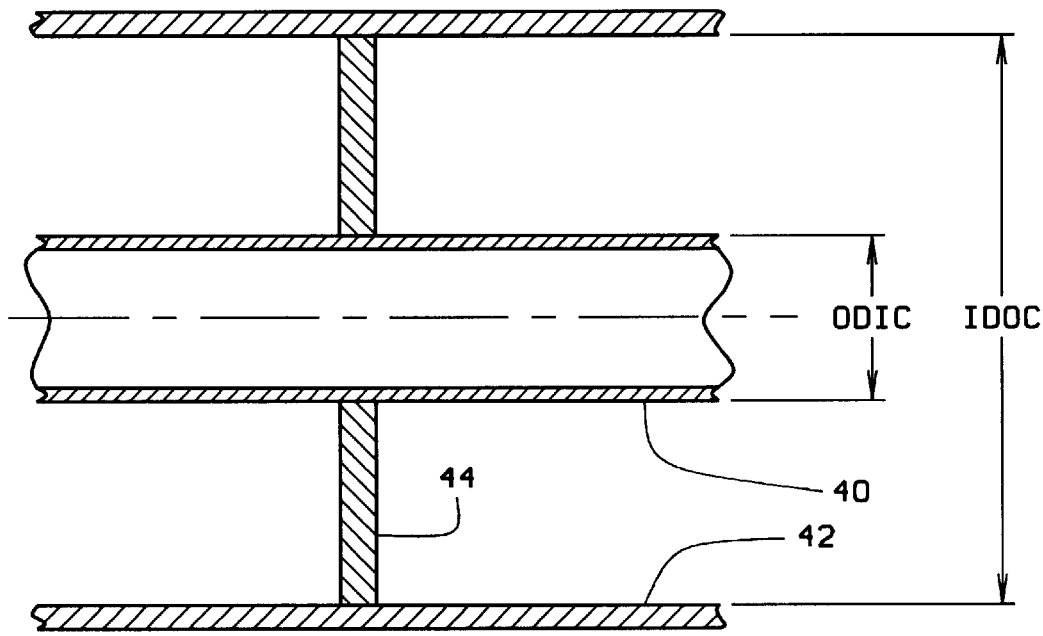
FIG. 3 is a cross sectional view of a coaxial transmission line segment of the NMR probe.
Figure 4:
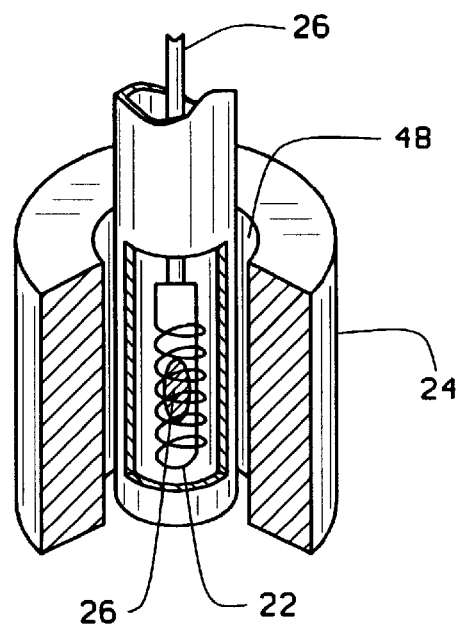
FIG. 4 is a cut away perspective view of a typical NMR sample coil and magnet assembly.

Radio frequency signals are transmitted to and from the sample coil circuit 22 by means of the transmission network 26. Each component of the transmission network 26 is a coaxial transmission line segment, having a length specifically selected to provide an impedance match for an individually tuned radio frequency. Each coaxial transmission line comprises an inner tubular conductor 40 and outer tubular conductor 42, (FIG. 3) structured such that the ratio of the inner diameter IDOC of the outer conductor 42 to the outer diameter ODIC of the inner conductor 40 is approximately 3.59:1. The coaxial transmission lines are preferably composed of a copper tubing or pipes, which are essentially air dielectric since the inner conductor 40 is supported at a few points with Teflon® discs 44. Furthermore, the inner diameter of the outer coaxial conductor 42 must be of sufficient size so as to allow for the conventional tuning and coupling circuits described generally below to be located within the outer conductor 42. The preferred embodiment of the NMR probe 20 employs outer conductors 42 having a large outer diameters on the order of 2 inches or more to increase the NMR probe 20 efficiency and to reduce the electrical resistance of the transmission network 26.

During normal operation of the NMR probe 20, high voltages of several thousand volts for each channel used during a particular experiment will be present at the sample coil circuit 22. In connecting the sample coil circuit 22 to the transmission network 26, connections capable of withstanding these voltage must be made. These connections must be made as short as possible to minimize radio-frequency losses in them and of sufficient size so as to carry large radio-frequency currents. The connections need to have smooth surfaces and large diameters to prevent the buildup of high electric field strengths that can cause corona discharge.

Accordingly, segment 32 connects the sample coil circuit 22 to the transmission network 26. The length L1 of segment 32 is calculated from standard transmission line equations using the value of the terminating impedance of the sample coil circuit 22 and the parameters of the transmission network 26 itself, such as radial dimensions, and composition. In practice, once the theoretical length of segment 32 is calculated, the exact length L1 is determined using standard radio frequency measurement techniques. To accommodate the difficulty in cutting an exactly length of the copper pipe comprising the coaxial transmission line, a variable capacitor 46 is added internally to the segment 32, connecting the inner conductor 40 to the outer conductor 42 at a point of high impedance. The variable capacitor 46 is then tuned to adjust the signal impedance of the segment 32 such that a point of minimum impedance for the highest tuned frequency of the NMR probe 20 is exactly positioned at a junction point A in the transmission network 26.

The highest frequency tuned by the present embodiment of the NMR probe 20 is the proton frequency of 500 MHz. As is well known by those familiar with transmission lines, points of minimum impedance for particular radio-frequencies on coaxial transmission lines repeat every one-half wavelength. In some implementations of the NMR probe 20, it is possible for the first occurrence of the minimum impedance point for the highest tuned frequency to be physically present within the bore 48 of the probe magnet 24, preventing its use as a junction point. In such situations, the first point of minimum impedance occurring external to the magnet bore 48 is employed as an alternate junction point. In FIG. 1, junction point A is positioned at the third minimum impedance point for the proton frequencies along segment 32.

Interconnected to segment 32 and the sample coil circuit 22 at junction point A, are coaxial transmission line segments 50, 52, and 54, each impedance matched to one or more tuned radio frequencies.

Coaxial transmission line segment 50, along with a shunt element 56 connects junction point A with a radio-frequency input-output (I/O) circuit 58 suitable for proton irradiation. The proton I/O circuit 58 comprises a 500 MHz input-output port 60 adapted to a characteristic impedance, for example, 50 ohms, connected in series with a conventional tuning and coupling circuits comprising a variable capacitor 62 and a grounded variable capacitor 64.

To provide a high impedance at junction point A towards the proton I/O circuit 58 and to minimize power loss in that direction, the shunt element 56 is positioned a length L2 along segment 50, at junction point B, approximately a quarter wavelength of the fluorine frequency from junction point A. Shunt element 56 acts as a radio frequency trap for the fluorine frequency, creating a very low impedance at junction point B for the fluorine frequency, and at the same time presenting a high impedance to the proton frequency. The length L3 of shunt element 56 is slightly longer than a quarter wavelength at the fluorine frequency, permitting internal variable capacitors 66 and 68 to be adjusted to meet the desired impedance conditions described above.

Finally, the overall length L4 of segment 50 is selected such that the length from junction point B to the proton I/O circuit 58 permits reasonable values for variable capacitor 62 and grounded variable capacitor 64 to be used to tune and match to the desired 50 ohm impedance. Included on segment 50, two fixed capacitors 70 and 72, each valued at about 10 pico-farads increase the overall efficiency of the low frequency channels by isolating them from the proton I/O circuit 58 and the fluorine trap 56. Capacitor 70 is positioned on the inner coaxial conductor 40 adjacent to junction point A, capacitor 72 is positioned adjacent junction point B.

Functioning similar to segment 50, coaxial transmission line segment 52 provides a connection between the transmission network 26 and a radio frequency input-output circuit 74 suitable for fluorine irradiation. The fluorine I/O circuit 74 comprises a 470 MHz input-output port 76 adapted to a characteristic impedance, for example, 50 ohms, connected in series with a conventional tuning and coupling circuit comprising a variable capacitor 78 and a grounded variable capacitor 80. The length L5 of segment 52 is selected such that it provides an impedance transformation of the impedance into segment 52 from junction point A, where it is capacitive, to the fluorine I/O circuit 74 to where it is inductive, and hence may be tuned and matched by reasonable values for capacitors 78 and 80.

The remaining coaxial transmission line segment connected to Junction Point A is segment 54, which serves as a connection link from the lower radio frequency channels to the sample coil circuit 22 via segment 32. The input impedance from junction point A to segment 54 must be high at the fluorine frequency to prevent fluorine signal power from being drained into segment 54, reducing the efficiency of the fluorine I/O circuit 74. To maintain the desired high impedance at the fluorine frequency, the length L6 of segment 54, terminating at junction point C, is a quarter wavelength at the fluorine frequency. Additionally, junction point C is maintained at a low impedance to the fluorine frequency by a shunt element 82 connected at junction point C. Shunt element 82 is a coaxial transmission line segment with a length L7 slightly less than a quarter wavelength at the fluorine frequency, and containing a variable capacitor 84 interconnecting the inner conductor 40 with the outer conductor 42. The variable capacitor 84 is adjusted to create a minimum impedance at junction point C as set forth above.

Additionally connected to junction point C is the coaxial transmission line segment 86 and a fixed capacitor 88 connected to electrical ground G. The fixed capacitor 88 aids in maintaining the minimum impedance at junction point C, but is primarily used to tune the lower frequency channels connected to junction point C by segment 86. The capacitance of the fixed capacitor 88 affects the lengths of each subsequent coaxial transmission line segment used for lower radio frequencies in the transmission network 26.

The length L8 of coaxial transmission line segment 86, terminating at junction point D, is selected to produce a minimum impedance at junction point D for the next lower radio frequency tuned on the NMR probe 20. Functioning similar to variable capacitor 46, a variable capacitor 90 contained within segment 86 permits the location of the next impedance minimum point to be electronically adjusted to a fine degree of precision along the length L8 of segment 86. In the present embodiment shown in FIG. 1, the next lower radio frequency corresponds to that of phosphorous.

Operating similar to segment 52, a coaxial transmission line segment 92 provides a connection between junction point D on the transmission network 26 and a radio frequency input-output circuit 94 suitable for phosphorous irradiation. The phosphorous I/O circuit 94 comprises a 202 MHz input-output port 96 adapted to a characteristic impedance, for example, 50 ohms, connected in series with a conventional tuning and coupling circuit comprising a variable capacitor 98 and a grounded variable capacitor 100. The length L9 of segment 92 is selected such that the impedance minimum for phosphorus at junction point D is transformed into an inductive impedance which can then be tuned and matched by reasonable values for the variable capacitors 98 and 100.

Additionally connected to junction point D is the coaxial transmission line segment 102 and a fixed capacitor 104 connected to electrical ground. The fixed capacitor 104 aids in maintaining the minimum impedance at junction point D, but is primarily used to tune the lower frequency channels connected to junction point D by segment 102, much the same as fixed capacitor 88 tunes junction point C. The capacitance of fixed capacitor 104 similarly affects the lengths of each subsequent coaxial transmission line segment for lower radio frequencies in the transmission network 26.

The length L10 of coaxial transmission line segment 102, terminating at junction point E, is selected to produce a minimum impedance at junction point E for the next lower radio frequency tuned on the NMR probe 20. Functioning similar to variable capacitor 90, a variable capacitor 106 contained within segment 102 permits the location of the next impedance minimum point to the electronically adjusted to a fine degree of precision along the length L10 of segment 102. In the present embodiment shown in FIG. 1, the next lower radio frequency corresponds to that of carbon-13.

Operating similar to segment 92, a coaxial transmission line segment 108 provides a connection between junction point E on the transmission network 26 and a radio frequency input-output circuit 110 suitable for carbon-13 irradiation. The carbon-13 I/O circuit 110 comprises a 125 MHz input-output port 112 adapted to a characteristic impedance, for example, 50 ohms, connected in series with a conventional tuning and coupling circuit comprising a variable capacitor 114 and a grounded variable capacitor 116. The length L11 of segment 108 is selected such that the impedance minimum for carbon-13 at junction point E is transformed into an inductive impedance which can then be tuned and matched by reasonable values for the variable capacitors 114 and 116.

Additionally connected to junction point E is the coaxial transmission line segment 118 and a fixed capacitor 120 connected to electrical ground G. The fixed capacitor 120 aids in maintaining the minimum impedance at junction point E, but is primarily used to tune the lower frequency channels connected to junction point E by segment 118, much the same as fixed capacitor 104 tunes junction point D. The capacitance of fixed capacitor 120 affects the lengths of each subsequent coaxial transmission line segment for lower radio frequencies in the transmission network 26.

The length L12 of coaxial transmission line segment 118, terminating at junction point F, is selected to produce a minimum impedance at junction point F for the next radio frequency tuned on the NMR probe 20. In the present embodiment shown in FIG. 1, the next radio frequency corresponds to that of nitrogen-15. This is an example where the frequency of the next channel to add is not the next lowest frequency but is the next occurring impedance minima.

Operating similar to segment 108, a coaxial transmission line segment 122 provides a connection between junction point F on the transmission network 26 and a radio frequency input-output circuit 124 suitable for nitrogen-15 irradiation. The nitrogen-15 I/O circuit 124 comprises a 50 MHz input-output port 126 adapted to a characteristic impedance, for example, 50 ohms, connected in series with a conventional tuning and coupling circuit comprising a variable capacitor 128 and a grounded variable capacitor 130. The length L13 of segment 122 is selected such that the impedance minimum for nitrogen-15 at junction point F is transformed into an inductive impedance which can then be tuned and matched by reasonable values for the variable capacitors 128 and 130.

As seen in FIG. 1, a final coaxial transmission line segment 132 is connected to junction point F to provide connection to a radio frequency input-output circuit 134 suitable for oxygen-17 irradiation at 67.78 MHz, through a radio frequency I/O port 136. The length L14 of segment 132 is selected such that the variable capacitor 138, and the grounded variable capacitor 140 may be tuned and matched to provide a 50 ohm characteristic impedance match for the oxygen-17 I/O circuit 134.

Although the invention has been illustrated by a single embodiment employing six separately tuned radio frequencies, it is not limited thereto. Changes and modifications of the illustrated embodiment can be made which do not constitute departure from the spirit and scope of the invention. In particular, embodiments of the present invention may be constructed employing any number of different NMR frequencies by altering the quantity and impedance characteristics of the individual radio-frequency input-output means and the associated coaxial transmission line segment lengths.

As can be seen from the modular nature of the design of the NMR probe 20, any channel or channels added after a particular junction point may be changed to another frequency which is also lower than the channels located above it without altering the higher frequency channel settings. This makes possible, for example, the insertion of another group of nuclei for lower frequency channels at junction point E without altering the characteristics at junction points A–D.

More particularly, an embodiment of the present invention may be constructed suitable for Deuterium irradiation by altering the 67.78 MHz input-output port 136 to a 76.75 MHz input-output port. Correspondingly, the length L14 of transmission line segment 132 would be recalculated to provide for the proper impedance matching by variable capacitors 138 and 140 as described above.

In view of the above, it will be seen that the several objects of the invention are achieved and other advantageous results are obtained. As various changes could be made in the above constructions without departing from the scope of the invention, it is intended that all matter contained in the above description or shown in the accompanying drawings shall be interpreted as illustrative and not in a limiting sense.

What is claimed is:

1. A multi-tuned single coil transmission line probe for a nuclear magnetic resonance (NMR) spectrometer having a uniform magnetic field, said probe comprising:

a coaxial transmission line network, the network including an outer electrical conductor and a coaxial inner electrical conductor;

a radio frequency sample coil electrically coupled to said coaxial transmission line network; and a plurality of radio frequency input-output connectors, each of said input-output connectors adapted to a unique radio frequency and electrically coupled to said coaxial transmission line network by capacitive tuning circuits at a frequency-matched minimum impedance point.

2. The probe of claim 1 wherein said sample coil sufficiently irradiates a sample with a plurality of unique radio frequencies received from said input-output connectors over said coaxial transmission line network to excite the nuclei of said sample at each of said radio frequencies and wherein said sample coil receives and transmits radio frequency signals generated by said excited sample nuclei to said input-output means connectors over said coaxial transmission line network.

3. The probe of claim 2 in which each of said capacitive tuning circuits is remotely disposed from said sample coil and said magnetic field.

4. The probe of claim 2 in which each of said capacitive tuning circuits includes a series connected variable capacitor and a grounded variable capacitor.

5. The probe of claim 4 in which each of said capacitive tuning circuits further includes a segment of coaxial transmission line interconnecting said series connected variable capacitor and said coaxial transmission line network, the length of said coaxial transmission line selected so as to transform said frequency-matched minimum impedance at the point of connection to the network into an inductive impedance at said series connected variable capacitor.

6. The probe of claim 4 in which each of said capacitive tuning circuits are contained within the outer electrical conductor of said coaxial transmission line network.

7. The probe of claim 4 in which said capacitive tuning circuits can adjust said input-output radio frequencies by ±1–2%.

8. The probe of claim 2, in which said inner and outer electrical conductors of the coaxial transmission line network are composed of cylindrical conducting tubes, the ratio of the inner diameter of the outer conducting tube to the outer diameter of the inner conducting tube being approximately 3.59:1.

9. The probe of claim 8 in which said outer conducting tube has a outer diameter greater than two inches.

10. The probe of claim 8 in which said inner and outer conducting tubes are a highly conductive material.

11. The probe of claim 10 in which said inner and outer conducting tubes are copper.

12. The probe of claim 8 in which said coaxial transmission line network contains a low loss dielectric material.

13. The probe of claim 12 in which said coaxial transmission line network is air dielectric.

14. The probe of claim 2, in which said unique input-output radio frequencies are separated by no less than 6% differences.

15. The probe of claim 2, in which said unique input-output radio frequencies range from 50 MHz to 500 MHz.

16. The probe of claim 2, in which said plurality of radio frequency input-output connectors include:

a radio frequency input-output connector adapted to the proton radio frequency of approximately 500.0 MHz;

a radio frequency input-output connector adapted to the fluorine radio frequency of approximately 470.0 MHz;

a radio frequency input-output connector adapted to the phosphorus radio frequency of approximately 202.0 MHz;

a radio frequency input-output connector adapted to the carbon-13 radio frequency of approximately 125.0 MHz; and a radio frequency input-output connector adapted to the nitrogen-15 radio frequency of approximately 50.0 MHz.

17. The probe of claim 16 in which said plurality of radio frequency input-output connectors further include a radio frequency input-output connector adapted to the deuterium radio frequency of approximately 76.75 MHz.

18. The probe of claim 16 in which said plurality of radio frequency input-output connectors further include a radio frequency input-output connector adapted to the oxygen-17 radio frequency of approximately 67.78 MHz.

19. The probe of claim 1 wherein the coaxial transmission line network further includes a plurality of capacitive tuning elements interconnecting the inner and outer electrical conductors, said capacitive tuning elements affecting the location of said frequency-matched minimum impedance points.

20. The probe of claim 19 wherein the interconnecting tuning elements are variable capacitors.

* * * * *